United States Patent
Fujihira et al.

(10) Patent No.: US 7,928,469 B2
(45) Date of Patent: Apr. 19, 2011

(54) MOSFET AND METHOD FOR MANUFACTURING MOSFET

(75) Inventors: Keiko Fujihira, Tokyo (JP); Naruhisa Miura, Tokyo (JP); Kenichi Ohtsuka, Tokyo (JP); Masayuki Imaizumi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 563 days.

(21) Appl. No.: 12/090,451

(22) PCT Filed: Oct. 6, 2006

(86) PCT No.: PCT/JP2006/320069
§ 371 (c)(1),
(2), (4) Date: Apr. 16, 2008

(87) PCT Pub. No.: WO2007/046254
PCT Pub. Date: Apr. 26, 2007

(65) Prior Publication Data
US 2009/0173997 A1      Jul. 9, 2009

(30) Foreign Application Priority Data
Oct. 19, 2005   (JP) .................. 2005-303949

(51) Int. Cl.
*H01L 29/74* (2006.01)
*H01L 31/111* (2006.01)

(52) U.S. Cl. ............... 257/134; 257/135; 257/E29.265; 257/E21.421; 438/137

(58) Field of Classification Search .................. 257/77, 257/134, 135, E27.148, E29.265, E29.314, 257/E21.421; 438/137, 138, 173
See application file for complete search history.

(56) References Cited

U.S. PATENT DOCUMENTS

| | | | |
|---|---|---|---|
| 4,684,413 A | 8/1987 | Goodman et al. | |
| 6,617,653 B1 | 9/2003 | Yokogawa et al. | |
| 7,808,003 B2 * | 10/2010 | Endo et al. | 257/77 |

FOREIGN PATENT DOCUMENTS

| | | |
|---|---|---|
| DE | 198 09 554 A1 | 9/1998 |
| JP | 2003 309262 | 10/2003 |
| JP | 2004 71750 | 3/2004 |
| JP | 2005 116605 | 4/2005 |
| KR | 10-2004-0082337 | 9/2004 |
| KR | 10-0708028 | 4/2007 |

* cited by examiner

*Primary Examiner* — Hoai V Pham
(74) *Attorney, Agent, or Firm* — Oblon, Spivak, McClelland, Maier & Neustadt, L.L.P.

(57) ABSTRACT

The present invention provides a MOSFET and so forth that offer high breakdown voltage and low on-state loss (high channel mobility and low gate threshold voltage) and that can easily achieve normally OFF. A drift layer 2 of a MOSFET made of silicon carbide according to the present invention has a first region 2a and a second region 2b. The first region 2a is a region from the surface to a first given depth. The second region 2b is formed in a region deeper than the first given depth. The impurity concentration of the first region 2a is lower than the impurity concentration of the second region 2b.

14 Claims, 13 Drawing Sheets

F I G . 1 8
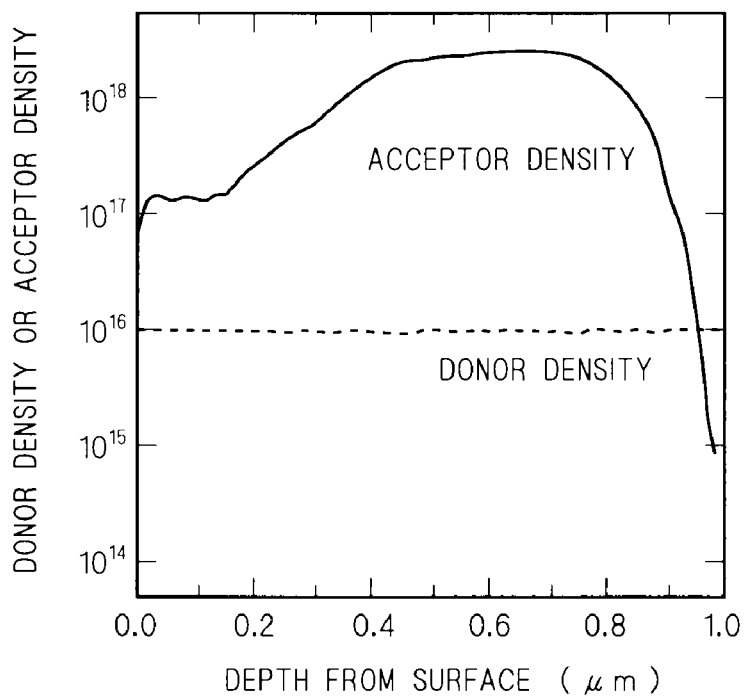
F I G . 1 9
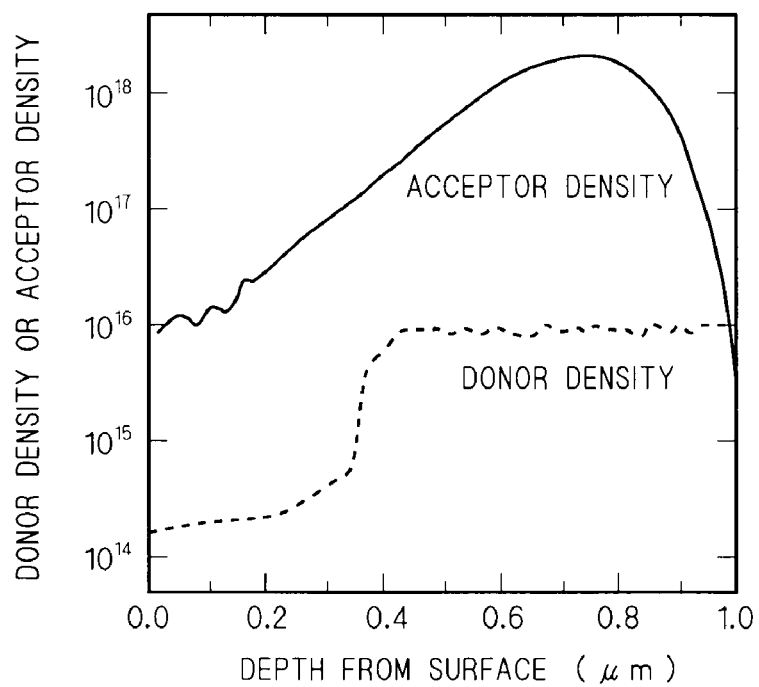

ately low impurity concentration on said relatively-high-impurity-concentration drift layer; and (D) implanting impurity ions of the second conductivity type with a relatively low concentration into said relatively-low-impurity-concentration drift layer, so as to form a base region having a relatively low impurity concentration, wherein said step (A) and said step (C) are conducted in different reactor chambers.

MOSFET AND METHOD FOR MANUFACTURING MOSFET

TECHNICAL FIELD

The present invention relates to MOSFETs and methods of manufacturing MOSFETs, and particularly to a MOSFET having a drift layer made of silicon carbide and a method of manufacturing the MOSFET.

BACKGROUND ART

High breakdown voltage, low-loss, and high-speed-switching vertical MOSFETs made of silicon carbide are recently developed. For such vertical MOSFETs, it is necessary to determine (control) the impurity concentration of the drift layer and the impurity concentration of the base regions by considering the breakdown voltage and ON-state resistance values (channel mobility) of the vertical MOSFETs.

For example, the silicon-carbide semiconductor device described in Patent Document 1 enables high breakdown voltage and low ON-state loss (high channel mobility (low ON-state resistance) and low threshold voltage). The technique of Patent Document 1 provides a silicon carbide drift layer of a first conductivity type and base regions of a second conductivity type formed in the surface of the drift layer. Also, an impurity of the first conductivity type is introduced in a portion that serves as a channel in the base regions. This structure is generally called an accumulation mode.

Patent Document 1: Japanese Patent Application Laid-Open No. 2003-309262

DISCLOSURE OF THE INVENTION

Problems to be Solved by the Invention

With the structure disclosed in Patent Document 1, which is of the accumulation mode, it is difficult to achieve normally OFF (i.e. a current flows in the channel when no voltage is applied to the gate electrode).

Accordingly, an object of the present invention is to provide a MOSFET and so forth that offer high breakdown voltage and high channel mobility and that can easily achieve normally OFF.

Means for Solving the Problems

In order to achieve the object above, a MOSFET according to claim 1 of the present invention includes: a drift layer formed on a main surface of a substrate, having a first conductivity type, and made of silicon carbide; a base region formed in a surface of said drift layer and having a second conductivity type; and a source region formed in a surface of said base region and having the first conductivity type, wherein said drift layer has a first region extending from the surface to a first given depth and a second region formed in a region deeper than said first given depth, and said first region has an impurity concentration lower than that of said second region.

Also, a MOSFET manufacturing method according to claim 13 includes the steps of: (A) growing a drift layer on a semiconductor substrate, said drift layer having a first conductivity type and a relatively high impurity concentration; (B) implanting impurity ions of a second conductivity type with a relatively high concentration into said relatively-high-impurity-concentration drift layer, so as to form a base region having a relatively high impurity concentration; (C) growing a drift layer having the first conductivity type and having a relatively low impurity concentration on said relatively-high-impurity-concentration drift layer; and (D) implanting impurity ions of the second conductivity type with a relatively low concentration into said relatively-low-impurity-concentration drift layer, so as to form a base region having a relatively low impurity concentration, wherein said step (A) and said step (C) are conducted in different reactor chambers.

Effects of the Invention

The MOSFET according to claim 1 of the present invention includes: a drift layer formed on a main surface of a substrate, having a first conductivity type, and made of silicon carbide; a base region formed in a surface of said drift layer and having a second conductivity type; and a source region formed in a surface of said base region and having the first conductivity type, wherein said drift layer has a first region extending from the surface to a first given depth and a second region formed in a region deeper than said first given depth, and said first region has an impurity concentration lower than that of said second region. It is thus possible to provide a MOSFET having high breakdown voltage and low on-state loss (high channel mobility and low gate threshold voltage). The MOSFET does not have a so-called accumulation mode. It is therefore possible to easily realize normally OFF.

The MOSFET manufacturing method according to claim 13 includes the steps of: (A) growing a drift layer on a semiconductor substrate, said drift layer having a first conductivity type and a relatively high impurity concentration; (B) implanting impurity ions of a second conductivity type with a relatively high concentration into said relatively-high-impurity-concentration drift layer, so as to form a base region having a relatively high impurity concentration; (C) growing a drift layer having the first conductivity type and having a relatively low impurity concentration on said relatively-high-impurity-concentration drift layer; and (D) implanting impurity ions of the second conductivity type with a relatively low concentration into said relatively-low-impurity-concentration drift layer, so as to form a base region having a relatively low impurity concentration, wherein said step (A) and said step (C) are conducted in different reactor chambers. It is thus possible to provide the MOSFET of claim 1 having desired breakdown voltage value, desired high channel mobility, and desired low gate threshold voltage, in a more accurate manner.

These and other objects, features, aspects and advantages of the present invention will become more apparent from the following detailed description and the accompanying drawings.

BRIEF DESCRIPTION OF THE DRAWINGS

FIG. 18 A diagram showing the results of an experiment on the impurity concentration of the channel layer.

FIG. 19 A diagram showing the results of an experiment on the impurity concentration of the channel layer.

BEST MODE FOR CARRYING OUT THE INVENTION

Now, the present invention will be specifically described referring to the diagrams illustrating the preferred embodiments.

First Preferred Embodiment

Figure 1:
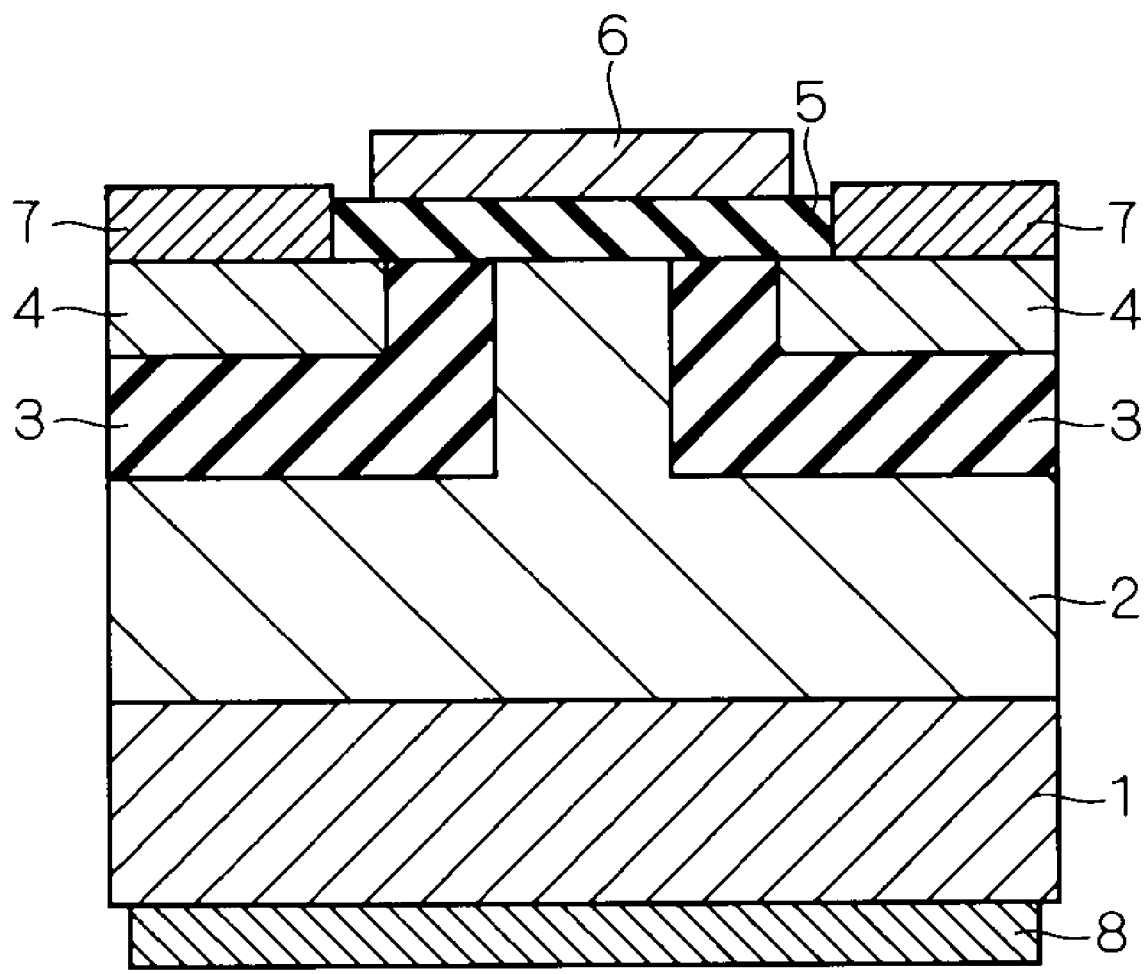
FIG. 1 A cross-sectional view illustrating the structure of a vertical MOSFET according to a first preferred embodiment.

FIG. 1 is a cross-sectional view illustrating the structure of a vertical MOSFET made of silicon carbide according to this preferred embodiment.

A drift layer 2 is formed on a first main surface of a semiconductor substrate 1.

The semiconductor substrate 1 has a first conductivity type (which is n type in this preferred embodiment). The semiconductor substrate 1 is made of silicon carbide. The surface orientation of the first main surface of the semiconductor substrate 1 may be (0001), (000-1), or (11-20). Such planes may have an off angle. The polytype of the semiconductor substrate 1 may be 4H, 6H, or 3C.

The drift layer 2, too, has the first conductivity type and is made of silicon carbide. As will be described later, the drift layer 2 grows on the first main surface of the semiconductor substrate 1. Accordingly, the surface orientation of the drift layer 2 is the same as the surface orientation of the first main surface of the semiconductor substrate 1. More specifically, when the first main surface of the semiconductor substrate 1 has a (0001) surface orientation, the surface of the drift layer 2 grown thereon has a (0001) surface orientation. When the first main surface of the semiconductor substrate 1 has a (000-1) surface orientation, the surface of the drift layer 2 grown thereon has a (000-1) surface orientation. When the first main surface of the semiconductor substrate 1 has a (11-20) surface orientation, the surface of the drift layer 2 grown thereon has a (11-20) surface orientation.

Base regions 3 are formed in the surface of the drift layer 2. The base regions 3 have a second conductivity type (which is p type in this preferred embodiment). In the cross-sectional view of FIG. 1, the base regions 3 are formed in two positions separated from each other.

Source regions 4 are formed respectively in the surfaces of the base regions 3. The source regions 4 have the first conductivity type.

Thus, as shown in the cross-sectional view of FIG. 1, the structure of the vicinity of the surface of the drift layer 2 is formed of a source region 4, base region 3, drift layer 2, base region 3, and source region 4 that are arranged in horizontal direction (in the lateral direction in FIG. 1).

Also, as shown in FIG. 1, source electrodes 7 are formed respectively on the source regions 4. In cross-section, a gate insulating film 5 is formed between the source electrodes 7.

The gate insulating film 5 is formed on the drift layer 2, and the gate insulating film 5 is, more specifically, in cross-section, formed over the edge of a source region 4, a base region 3, the drift layer 2, a base region 3, and the edge of a source region 4.

A gate electrode 6 is formed on the gate insulating film 5. A drain electrode 8 is formed on a second main surface of the semiconductor substrate 1.

Figure 2:
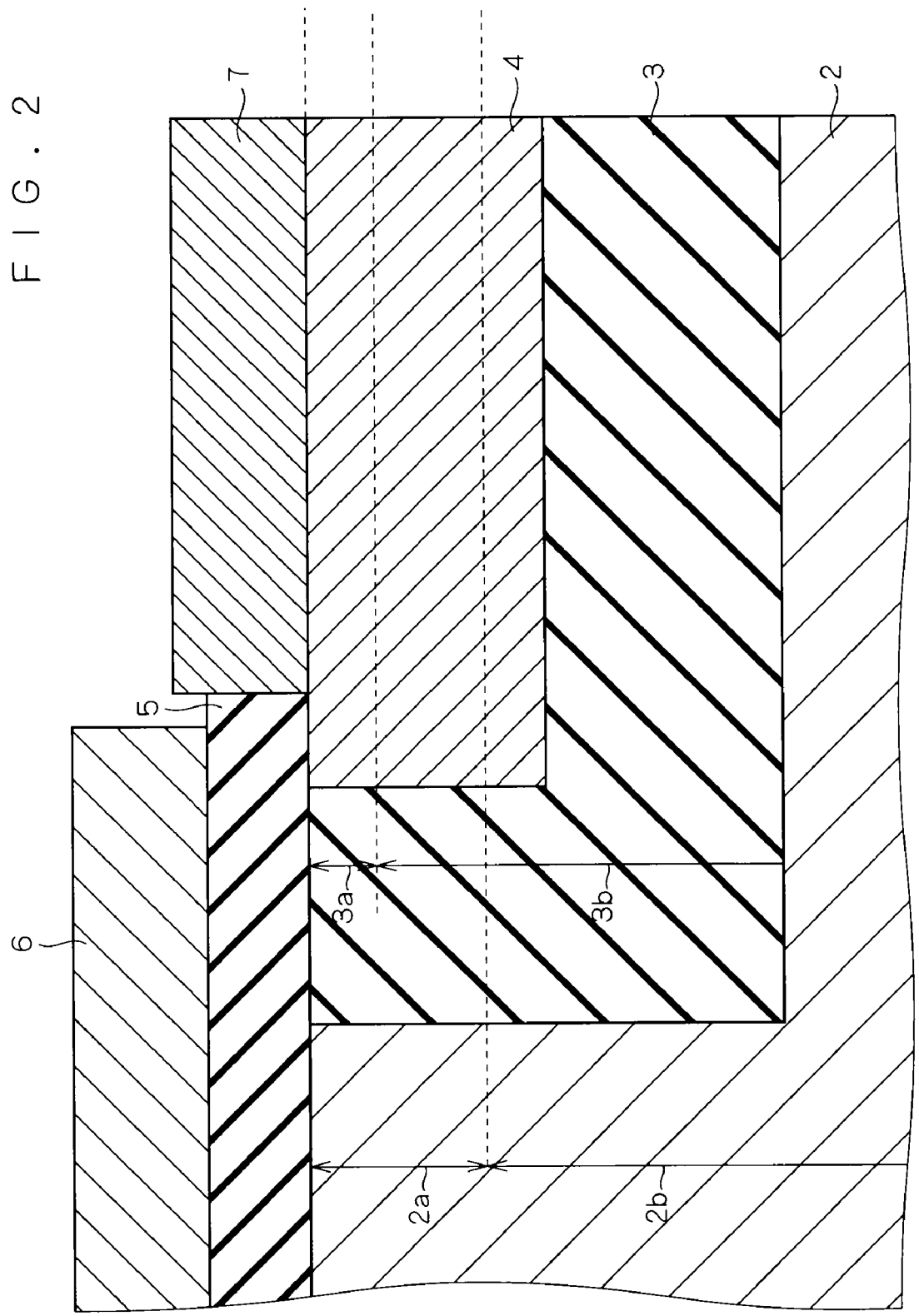
FIG. 2 An enlarged cross-sectional view showing the structure around the channel layer of the vertical MOSFET of the first preferred embodiment.

FIG. 2 is an enlarged cross-sectional view showing the vicinity of the surface of the drift layer 2 in an enlarged manner.

As shown in FIG. 2, the drift layer 2 has a first region 2a and a second region 2b. The first region 2a extends from the surface of the drift layer 2 to a first given depth. The second region 2b is formed in a region deeper than the first given depth. In this preferred embodiment, the thickness of the first region 2a (i.e. the first given depth) is 1 μm or less.

The impurity concentration of the first region 2a is lower than the impurity concentration of the second region 2b. The impurity concentration of the first region 2a is not less than $5\times10^{12}/cm^3$ nor more than $5\times10^{16}/cm^3$. The impurity concentration of the second region 2b is not less than $1\times10^{15}/cm^3$ nor more than $1\times10^{17}/cm^3$. It is desired that the impurity concentration in the first region 2a decrease from the bottom to the surface.

Also, as shown in FIG. 2, the base region 3 has a third region 3a and a fourth region 3b. The third region 3a extends from the surface of the base region 3 to a second given depth. The fourth region 3b is formed in a region deeper than the second given depth.

In this preferred embodiment, the thickness of the third region 3a (i.e. the second given depth) is 0.2 μm or less. The impurity concentration of the third region 3a is not less than $5\times10^{13}/cm^3$ nor more than $1\times10^{17}/cm^3$. The impurity concentration of the fourth region 3b is not less than $1\times10^{17}/cm^3$.

Next, a method for manufacturing the vertical silicon-carbide MOSFET of this preferred embodiment will be described referring to the cross-sectional process diagrams.

First, the semiconductor substrate 1 made of silicon carbide is prepared. In the description herein, it is assumed that the conductivity type of the semiconductor substrate 1 is n type.

Figure 3:
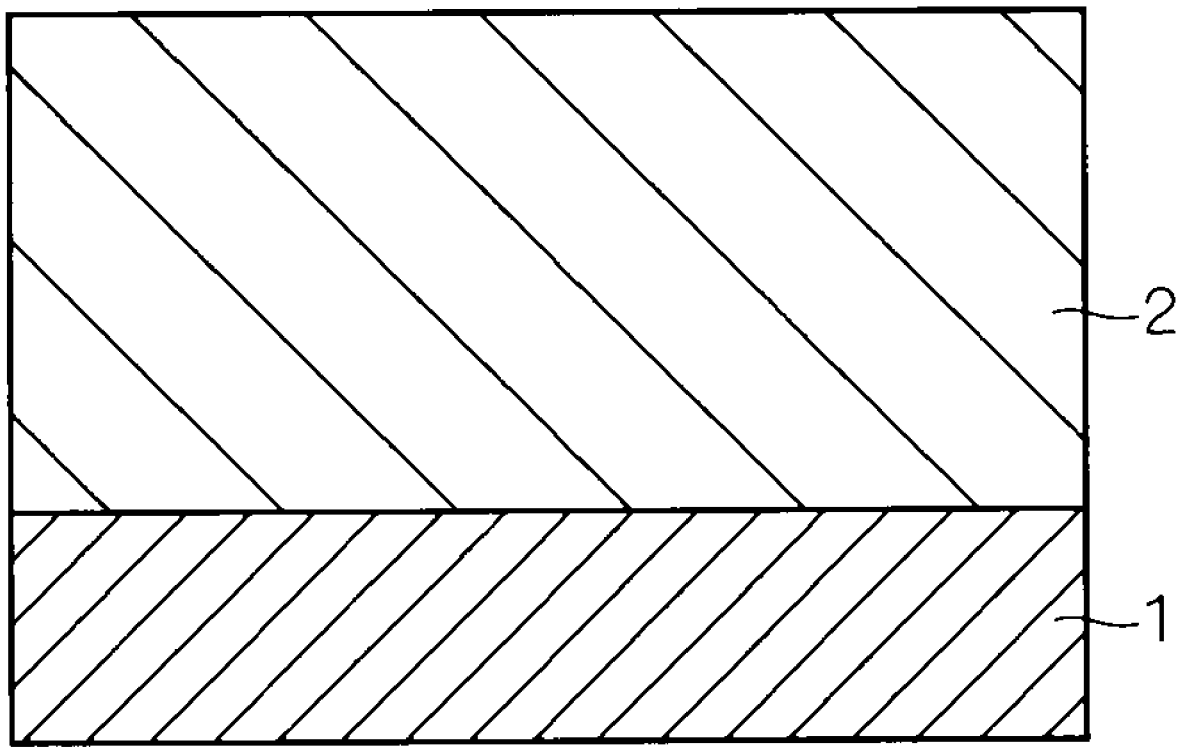
FIG. 3 A cross-sectional process diagram illustrating a method of manufacturing the vertical MOSFET of the first preferred embodiment.

Next, an epitaxial crystal growth process is applied to the semiconductor substrate 1. Thus, as shown in FIG. 3, the drift layer 2 is formed on the semiconductor substrate 1. A condition for the epitaxial growth is varied during the formation of the drift layer 2. Specifically, the doping concentration is controlled (varied) during the epitaxial growth process. It is thus possible to form the drift layer 2 having the first region 2a and the second region 2b as shown in FIG. 2.

The manufacturing process is conducted in such a way that the drift layer 2 is made of silicon carbide and of n type. The epitaxial growth is controlled in such a way that the thickness of the drift layer 2 is from 5 to 50 µm, for example.

The doping concentration is controlled during the epitaxial growth process in such a way that the thickness of the first region 2a is 1 µm or less, that the impurity concentration of the first region 2a is $5 \times 10^{12}$ to $5 \times 10^{16}/cm^3$, and that the impurity concentration of the second region 2b is $1 \times 10^{15}$ to $1 \times 10^{17}/cm^3$.

Figure 4:
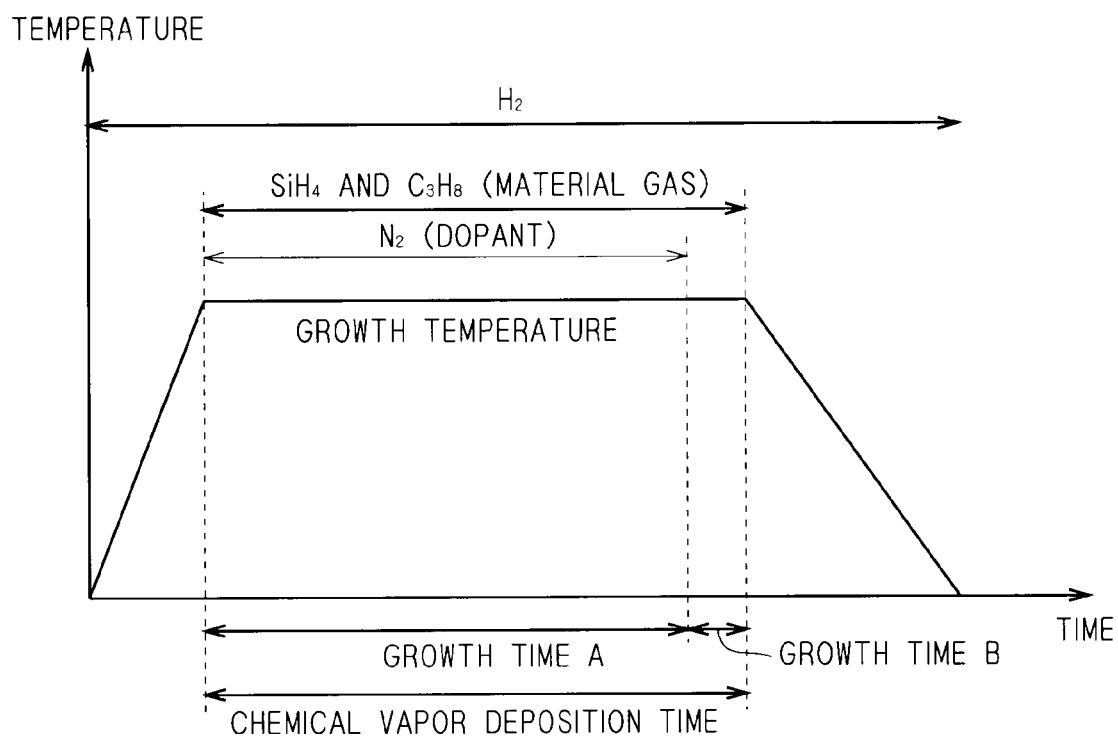
FIG. 4 A diagram illustrating a method for forming a drift layer.

A method for forming the n-type drift layer 2 by applying a chemical vapor deposition process will be specifically described. FIG. 4 is a diagram showing an example of the process for forming the drift layer 2 by the epitaxial crystal growth method described above.

In FIG. 4, the vertical axis shows temperature, and the horizontal axis shows time. The chemical vapor deposition process uses silane and propane as material gas to form the silicon-carbide drift layer 2 of n-type. The process uses hydrogen as carrier gas and nitrogen as n-type dopant gas.

Now, the processing steps will be described referring to FIG. 4.

First, the semiconductor substrate 1 is introduced into a reactor chamber. Next, in the reactor chamber, the semiconductor substrate 1 is elevated in temperature in an atmosphere of hydrogen. Then, when the temperature reaches around a chemical vapor deposition starting temperature (growth temperature), the material gas and dopant gas are introduced therein.

The flow rate of the dopant gas is set in such a way that the impurity concentration of the drift layer 2 being formed (particularly, the second region 2b) is about $1 \times 10^{15}$ to $1 \times 10^{17}/cm^3$. After the growth temperature has been reached, the temperature is controlled to remain approximately constant. The chemical vapor deposition time is set such that the drift layer 2 has a thickness of about 5 to 50 µm.

As shown in FIG. 4, the chemical vapor deposition time can be roughly divided into a growth time A and a growth time B. In the growth time A, the dopant gas and material gas are introduced at given flow rates, and the temperature in the reactor chamber is kept at the growth temperature. On the other hand, in the growth time B, the material gas is introduced at a given flow rate (i.e. the introduction of the dopant gas is stopped (in the case of FIG. 4), or the amount of introduced dopant gas is decreased in an example different from FIG. 4), and the temperature in the reactor chamber is kept at the growth temperature.

Thanks to the presence of the second region 2b of the drift layer 2 formed in the growth time A, the completed MOSFET offers a breakdown voltage of several hundred V to 3 kV.

Also, after the growth time B has passed with the introduction of dopant gas being stopped, or with the flow rate (the amount of introduction) being reduced, the first region 2a is formed to a thickness of about 0.01 to 1 µm. The thickness (depth) of the first region 2a and its impurity concentration are adjusted by controlling the growth time B and the flow rate of the dopant gas.

In this process, even when the introduction of dopant gas is stopped, the dopant gas remains in the reactor chamber. Accordingly, the first region 2a can be grown by using the remaining dopant gas.

As mentioned earlier, it is desired that the impurity concentration in the first region 2a decrease from the bottom to the surface, and the range thereof is from about $5 \times 10^{12}$ to $5 \times 10^{16}/cm^3$.

Next, after the growth times A and B have passed (i.e. after the drift layer 2 has been formed), the temperature of the semiconductor substrate 1 having the drift layer 2 is decreased in an atmosphere of hydrogen (the temperature in the chamber is decreased).

Figure 5:
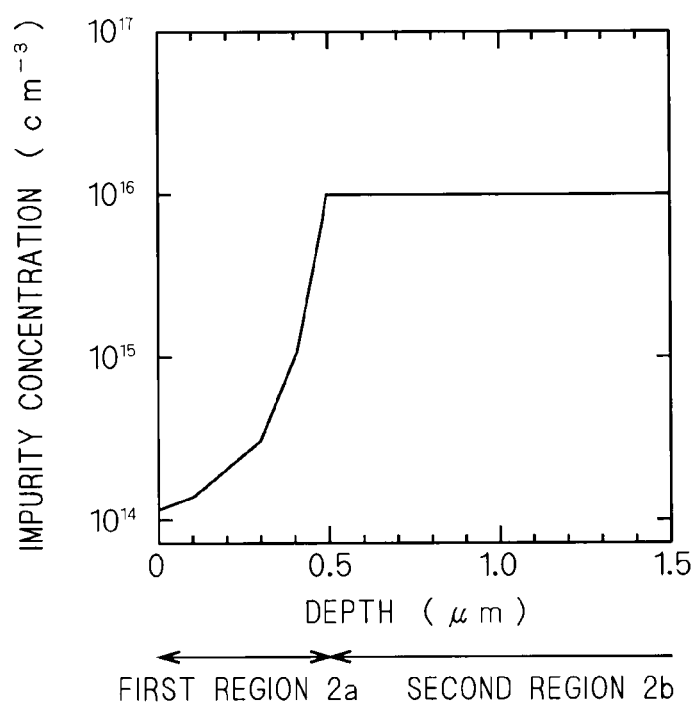
FIG. 5 A diagram illustrating the relation between impurity concentration and depth of the drift layer.

FIG. 5 is a diagram illustrating the relation between the impurity concentration and depth of the drift layer 2 formed by the method above. In FIG. 5, the impurity concentration of the first region 2a is from $1 \times 10^{14}$ to $1 \times 10^{16}/cm^3$, and the thickness is 0.5 µm. The impurity concentration of the second region 2b is $1 \times 10^{16}/cm^3$.

The thickness of the second region 2b is about 12 µm and the impurity concentration in this region is approximately constant at $1 \times 10^{16}/cm^3$, while FIG. 5 only shows the data about the region from the surface to a depth of about 1.5 µm.

FIG. 4 shows an example in which the drift layer 2 with a varied impurity concentration distribution is formed by a single step of epitaxial growth (chemical vapor deposition). However, the temperature in the reactor chamber may be elevated/decreased, or the reactor chamber may be changed, between the growth process of the second region 2b and the growth process of the first region 2a. That is, the drift layer 2 may be formed through two or more steps of epitaxial growth, e.g. by changing the growth method. In such a case, it is desired that the formation conditions in the individual epitaxial growth steps be controlled in such a way that the first and second regions 2a and 2b have the above-mentioned thickness and impurity concentration values.

Conducting the epitaxial growth in two separate steps enhances the controllability of the impurity concentration of the first region 2a and makes it easy to lower the concentration to $5 \times 10^{12}/cm^3$.

The growth of the drift layer 2 may be achieved by a molecular beam epitaxy method or a sublimation and recrystallization method, as well as chemical vapor deposition.

After the epitaxial crystal growth process, a photolithography process is applied to the drift layer 2. A mask of given shape is thus formed in a given area on the upper surface of the drift layer 2. The material of the mask can be resist, silicon dioxide, or silicon nitride, for example.

Figure 6:
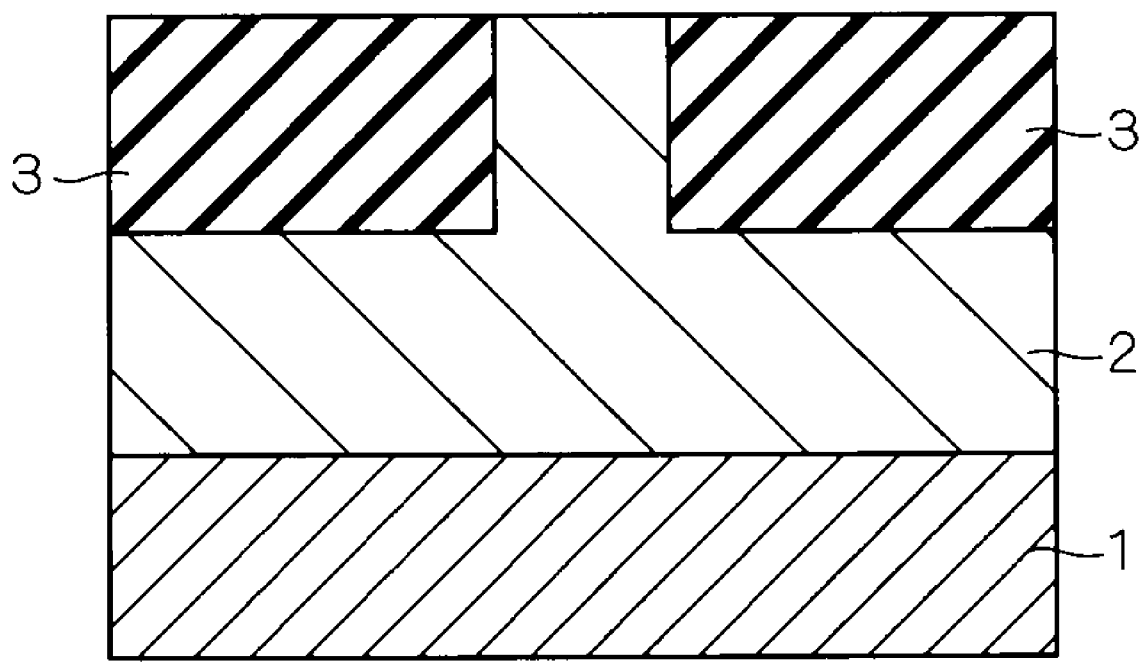
FIG. 6 A cross-sectional process diagram illustrating the vertical MOSFET manufacturing method of the first preferred embodiment.

After the mask formation, impurity ions (p type) are implanted into the upper surface of the drift layer 2. Thus, as shown in FIG. 6, a pair of base regions 3 of p type are formed. FIG. 6 is a diagram showing a cross section of the device after the removal of the mask. As shown in FIG. 6, the base regions 3 are formed in positions separated at a given interval in the surface of the drift layer 2.

When base regions 3 of p type are thus formed by the aforementioned ion implantation process (in other words, in the case of an n-channel MOSFET), the impurity ions can be boron (B) or aluminum (Al), for example.

On the other hand, when n-type base regions 3 are formed in a p-type drift layer 2, unlike those of this preferred embodiment (in other words, in the case of a p-channel MOSFET), the impurity ions can be phosphorous (P) or nitrogen (N), for example.

Also, in this ion implantation process, the depth of the base regions 3 is set not to exceed the thickness of the drift layer 2. For example, the thickness (depth) of the base regions 3 can be about 0.5 to 3 µm from the surface of the drift layer 2.

Also, the ion implantation process is to be controlled in such a manner that the impurity concentration of the second conductivity type (p type in this preferred embodiment) in the base regions 3 exceeds the impurity concentration of the first conductivity type (n type in this preferred embodiment) in the drift layer 2.

As shown in FIG. 2, the base regions 3 of the MOSFET of this preferred embodiment have the third region 3a and the fourth region 3b. It is therefore necessary to control (vary) the amount of implanted impurity ions during the ion implantation process. In the ion implantation process, it is necessary to control the amount of implanted impurity ions in such a manner that the impurity concentration of the third region 3a is $5\times10^{13}$ to $1\times10^{17}/cm^3$ and the impurity concentration of the fourth region 3b is $1\times10^{17}/cm^3$ or higher.

As mentioned earlier, the third region 3a has a depth (thickness) of 0.2 μm or less (more desirably, about 0.01 to 0.2 μm) from its upper surface (which can be regarded as the surface of the drift layer 2).

It is also necessary to design the impurity concentration distribution and the depth of the base regions 3 in such a way that the base regions 3 do not cause punch-through due to the depletion layer extending from the pn junction between the base regions 3 and the drift layer 2 during off operation of the completed MOSFET.

Figure 7:
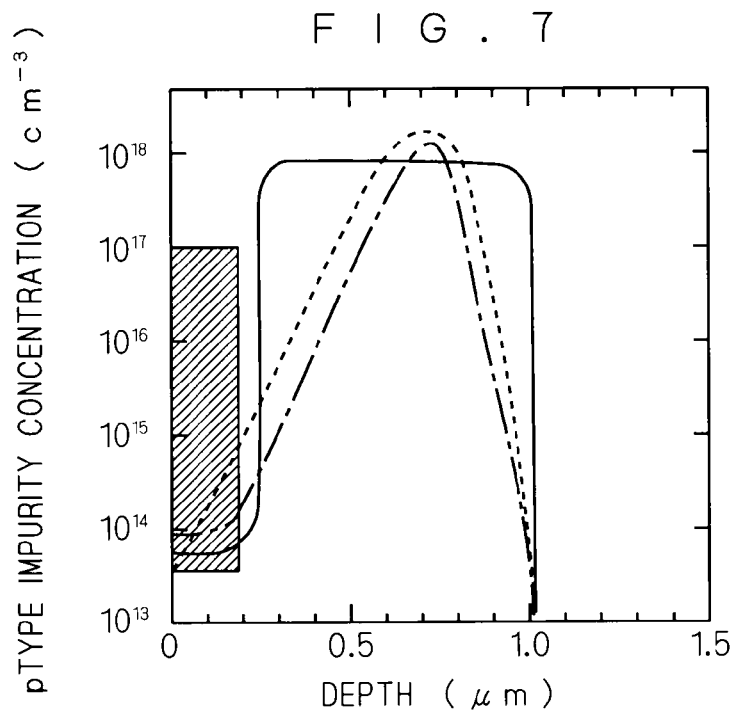
FIG. 7 A diagram illustrating a method of forming base regions.

Now, examples of the ion implant profile for the formation of the base regions 3 will be described. FIG. 7 is a diagram showing example ion implant profiles. The example profiles of FIG. 7 adopted aluminum (Al) ions as the p-type ion species.

In FIG. 7, the vertical axis shows the p-type impurity concentration ($cm^{-3}$). The horizontal axis shows the depth (μm) from the surface of the drift layer 2.

Also, in FIG. 7, the hatched region indicates the range of desirable depths and impurity concentrations of the third region 3a (a region defined by a depth of 0.2 μm from the outermost surface of the base regions 3 (which can be regarded also as the outermost surface of the drift layer 2) and by concentrations from $5\times10^{13}$ to $1\times10^{17}/cm^3$.

Also, in FIG. 7, the broken and solid lines show examples of impurity concentration distribution in the base regions 3 (three examples).

The example profiles shown by the broken lines (two patterns) are distributions in which the concentration becomes lower from a deeper portion to the surface of the base regions 3, except in the vicinity of the bottoms of the base regions 3. The profile shown by the solid line shows an impurity concentration that varies stepwise.

The example profiles of FIG. 7 show the base regions 3 having a depth of about 1.0 μm and having the third region 3a with a relatively low impurity concentration and the fourth region 3b with a relatively high impurity concentration (the region 3b is a given portion deeper than the third region 3a). In the vicinity of the bottoms of the base regions 3, the impurity concentration rapidly decreases as it becomes deeper.

As shown by the example profiles of FIG. 7, the presence of the fourth region 3b with a relatively high impurity concentration prevents punch-through of the base regions 3 (the achievement of high breakdown voltage). Also, the presence of the third region 3a with a relatively low impurity concentration offers high channel mobility.

The depth and impurity concentration of the third region 3a of this preferred embodiment are satisfactory when they are within the hatched region of FIG. 7. That is, the third region 3a can have any impurity concentration distribution as long as it is within the hatched region. Accordingly, the impurity concentration may remain constant in the region to 0.2 μm from the outermost surface of the base regions 3 (however, the impurity concentration has to be within the hatched region as mentioned above).

Figure 8:
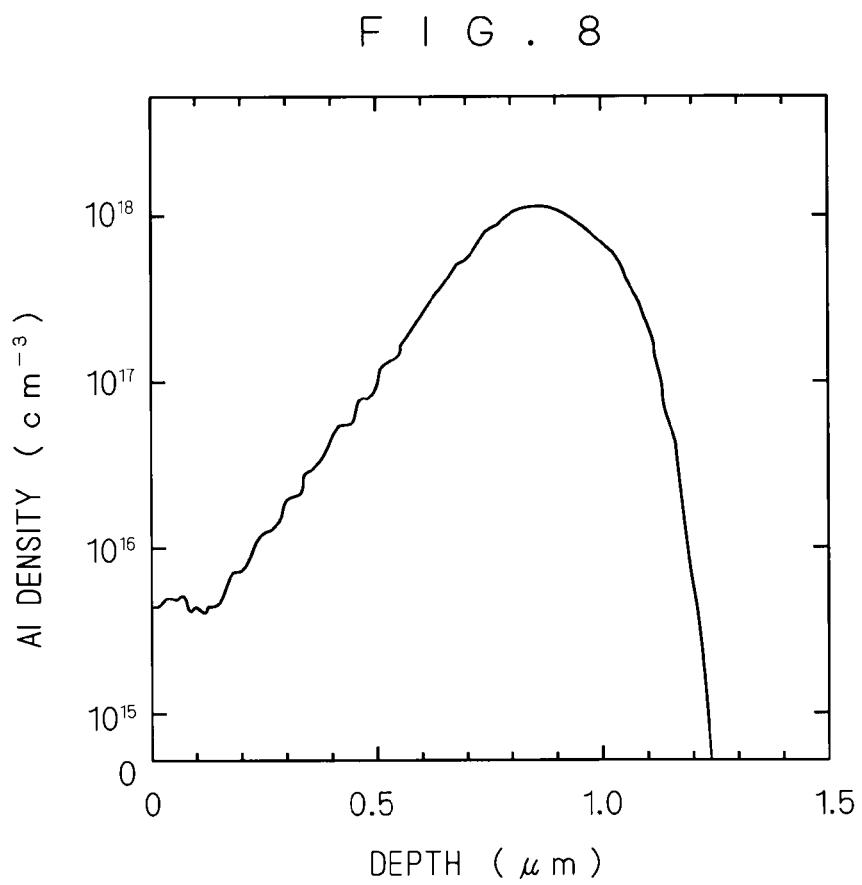
FIG. 8 A diagram showing the results of a simulation of the formation of the base regions.

FIG. 8 shows the results of a simulation of the formation of p-type base regions 3. FIG. 8 shows an impurity concentration profile of p-type base regions 3 that allows the completed MOSFET to hold a breakdown voltage of 1.2 kV when an n-type drift layer 2 (particularly, the second region 2b) has an impurity concentration of $1\times10^{16}/cm^3$.

This simulation was conducted with Al implant energies from 10 keV to 1 MeV and a total impurity implant density of $3.9\times10^{13}/cm^2$.

More specifically, the ion implantation was conducted multiple times during the simulation under the conditions of (10 keV, $8.0\times10^9/cm^2$), (20 keV, $2.0\times10^9/cm^2$), (40 keV, $1.3\times10^{10}/cm^2$), (70 keV, $1.0\times10^{10}/cm^2$), (700 keV, $1.0\times10^{13}/cm^2$), (800 keV, $1.0\times10^{13}/cm^2$), (900 keV, $9.0\times10^{12}/cm^2$), and (1 MeV, $1.1\times10^{13}/cm^2$).

The description now returns to the formation of the base regions 3. The base regions 3 may be formed by performing ion implantation multiple times as shown in FIG. 8.

Figure 9:
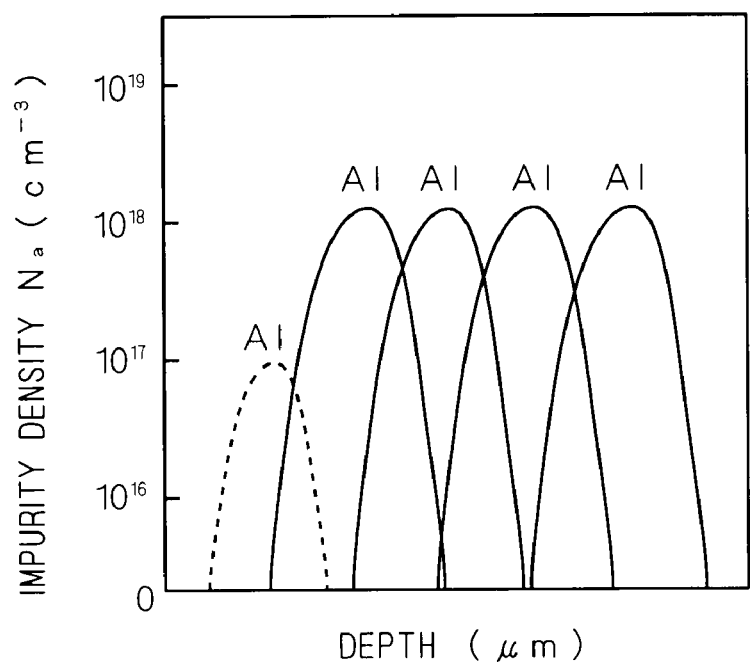
FIG. 9 A diagram illustrating a multi-step ion implantation process for the formation of the base regions.
Figure 10:
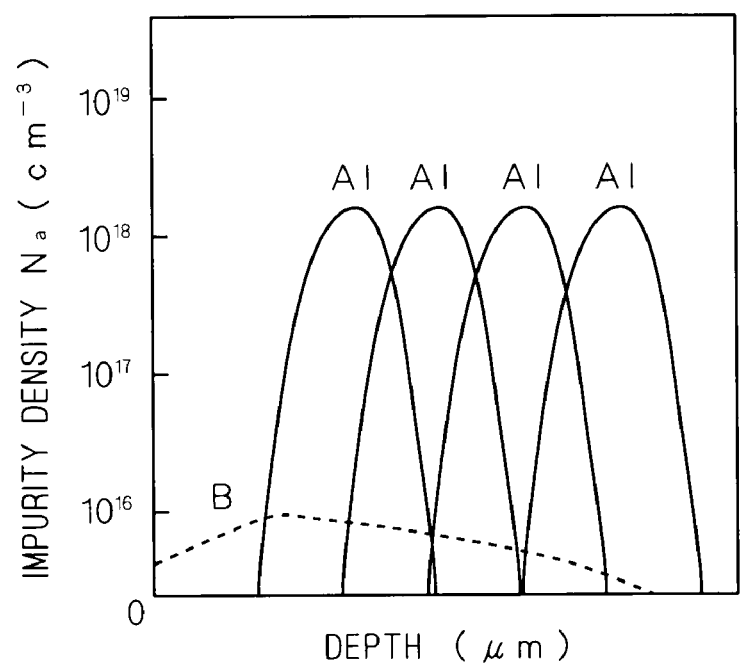
FIG. 10 A diagram illustrating a multi-step ion implantation process for the formation of the base regions.

For example, the base regions 3 having the third and fourth regions 3a and 3b may be formed, as shown in FIG. 9, by performing Al ion implantation five times, or as shown in FIG. 10, by performing Al ion implantation four times and B ion implantation once, and then performing thermal treatment.

In these ion implantation steps, the amount of ion implant and the ion implant energy are controlled (adjusted) such that a desired impurity concentration forms at a desired depth. In FIGS. 9 and 10, the overlap of the profiles form the final impurity concentration distribution of the base regions 3.

When aluminum (Al) is adopted as the ion species for the formation of the base regions 3, the aluminum (Al) hardly diffuses in the silicon carbide in the activating thermal treatment after the implantation. Accordingly, the profile of FIG. 9 remains almost unchanged even when it undergoes the thermal treatment.

Figure 11:
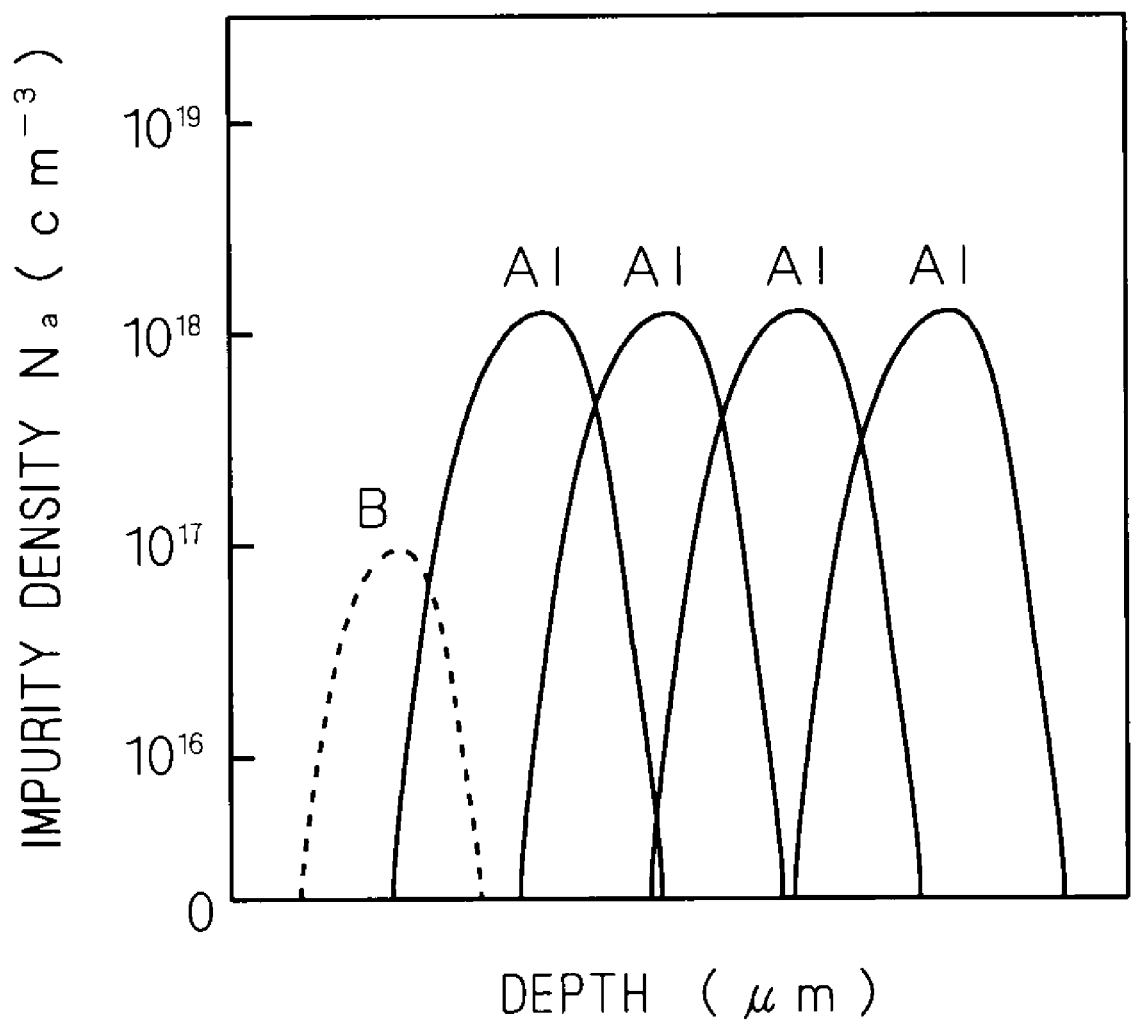
FIG. 11 A diagram illustrating a multi-step ion implantation process for the formation of the base regions.

On the other hand, when boron (B) is adopted as the ion species, the activating thermal treatment after the implantation causes the boron (B) to diffuse inwardly and outwardly from where it existed before the thermal treatment. Accordingly, even when the profile is as shown in FIG. 11 immediately after the ion implantation, it changes to the profile as shown in FIG. 10 after the thermal treatment.

The discussion above yields the conclusion below. That is, it is difficult to set a low impurity concentration in the third region 3a if the last ion implantation step (to the vicinities of the surfaces of the base regions 3) is conducted with Al ions. On the other hand, when the last ion implantation step is conducted with B ions, it is easy to set a relatively low impurity concentration in the third region 3a.

This is understood also from the profiles in the vicinity of the surfaces of the base regions 3 shown in FIGS. 9 and 10. This can be easily applied also when other ion species than Al and B are adopted, as long as it is known whether the ion species are easily diffused by thermal treatment.

The ion species implanted for the formation of the base regions 3 and the number of times that the implantation is performed are not limited to those mentioned above, but they can be selected arbitrarily.

Through the process steps described above, the p-type base regions 3 having a reduced concentration in the surface (i.e. having the third region 3a) have been formed in the n-type drifty layer 2 having a reduced concentration in the surface (i.e. having the first region 2a).

The impurity concentration distribution of the n-type drift layer 2 and the impurity concentration distribution of the p-type base regions 3 of this preferred embodiment can be measured by Secondary Ion Mass Spectroscopy (SIMS) or by Charged-Particle Activation Analysis (CPAA).

Next, after the formation of the base regions 3, a photolithography process is applied to the drift layer 2 in which the base regions 3 have been formed. Thus, a given pattern of mask is formed in a given area of the upper surface of the drift layer 2.

Figure 12:
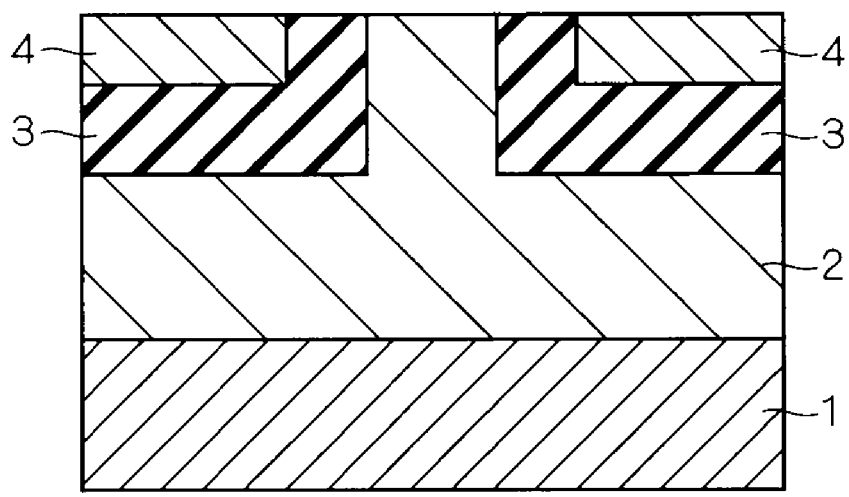
FIG. 12 A cross-sectional process diagram illustrating the vertical MOSFET manufacturing method of the first preferred embodiment.

After the formation of the mask, impurity ions (n type) are implanted into given areas of the upper surface of the base regions 3. Thus, as shown in FIG. 12, a pair of source regions 4 of n type are formed. FIG. 12 shows a cross section of the device after the removal of the mask.

In the ion implantation for the formation of the source regions 4, for forming source regions 4 of n type as mentioned above (in other words, in the case of an n-channel MOSFET), the impurity ions can be phosphorus (P) or nitrogen (N), for example.

On the other hand, when p-type source regions 4 are formed in n-type base regions 3, unlike those of this preferred embodiment (in other words, in the case of a p-channel MOSFET), the impurity ions can be boron (B) or aluminum (Al), for example.

It is necessary to control the ion implantation in such a manner that the depth of the source regions 4 does not exceed the depth of the base regions 3. The impurity concentration in the source regions 4 can be $1 \times 10^{18}$ to $1 \times 10^{21}/cm^3$, for example.

Next, after the ion implantation processing steps described above, the semiconductor device (silicon carbide substrate) being manufactured is introduced into a thermal treatment apparatus. A thermal treatment is thus applied to the silicon carbide substrate. The temperature of the thermal treatment is from 1300 to 1900° C., for example, and the time is from about 30 seconds to 1 hour, for example. This thermal treatment electrically activates the implanted ions.

Figure 13:
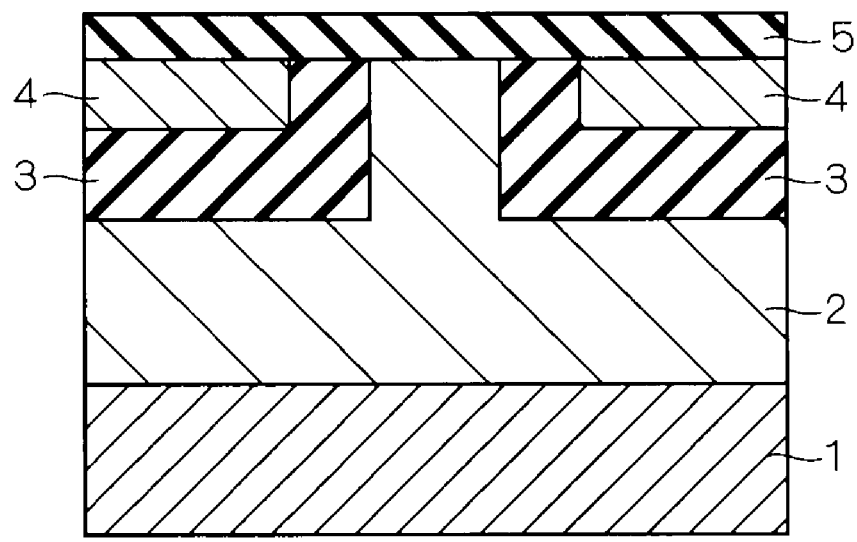
FIG. 13 A cross-sectional process diagram illustrating the vertical MOSFET manufacturing method of the first preferred embodiment.

Next, the silicon carbide substrate is taken out of the thermal treatment apparatus, and the gate insulating film 5 is formed on the surface of the drift layer 2 (FIG. 13).

The gate insulating film 5 can be a film of silicon dioxide, silicon nitride, silicon oxynitride, aluminum oxide, aluminum nitride, hafnium oxide, or zirconium oxide, for example. The gate insulating film 5 may be formed by thermal oxidation, or by chemical vapor deposition or physical vapor deposition. After the formation of the gate insulating film 5, a thermal treatment may be conducted in a gaseous atmosphere of argon, nitrogen, nitrogen monoxide, or oxygen dinitride, or of a mixture gas thereof.

Figure 14:
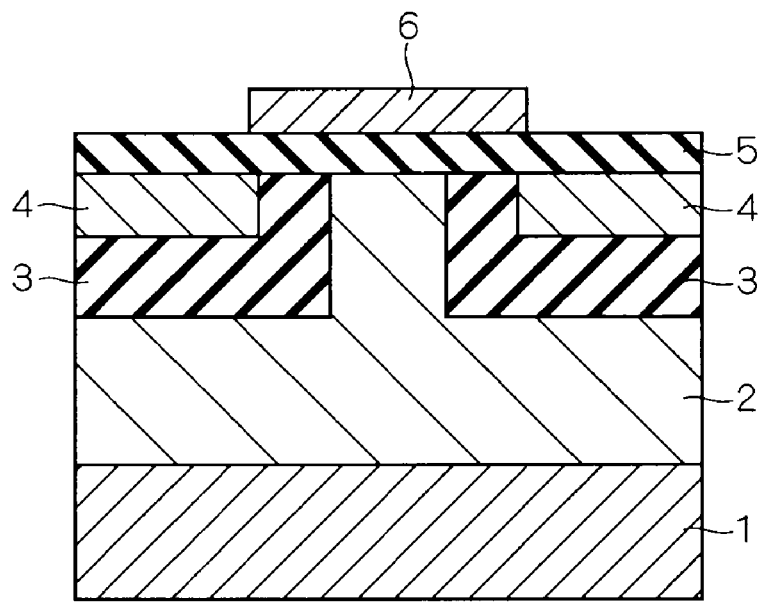
FIG. 14 A cross-sectional process diagram illustrating the vertical MOSFET manufacturing method of the first preferred embodiment.

Next, the gate electrode 6 is formed on the gate insulating film 5. Then, a series of photolithography steps is performed to pattern the gate electrode 6 into given shape (FIG. 14).

In plain view, the gate electrode 6 is located over both edges of the pair of base regions 3 and source regions 4 (it is desired that the gate electrode 6 overlap the edge of each source region 4 in an area of 10 nm to 5 μm, for example). It is desired that the gate electrode 6 be patterned such that the center position of the drift layer 2 between the base regions 3 coincides with the center position of the gate electrode 6.

The material of the gate electrode 6 may be n-type or p-type polycrystalline silicon, or n-type or p-type polycrystalline silicon carbide. The material of the gate electrode 6 may be a metal such as aluminum, titanium, molybdenum, tantalum, niobium, or tungsten, or a nitride thereof.

Figure 15:
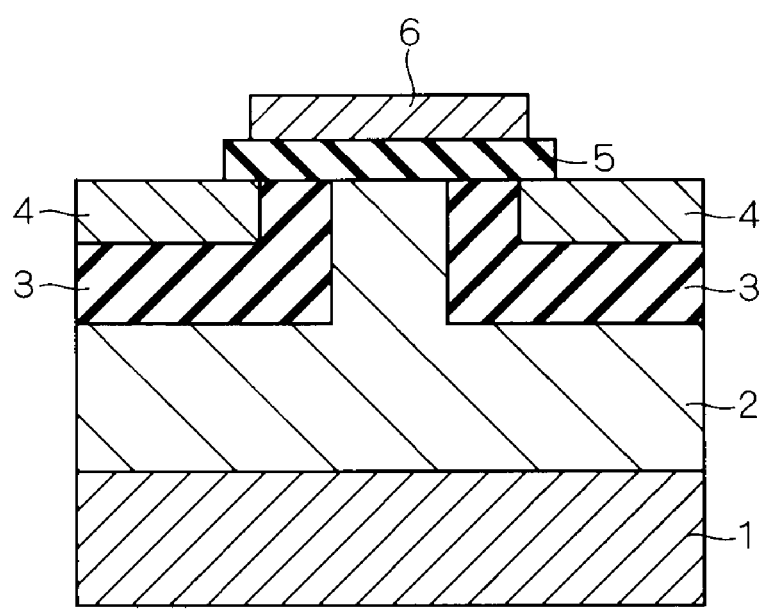
FIG. 15 A cross-sectional process diagram illustrating the vertical MOSFET manufacturing method of the first preferred embodiment.

Next, a patterning process with photolithography and a wet- or dry-etching process are performed, so as to remove unwanted portions of the gate insulating film 5 on the source regions 4 (FIG. 15).

Next, the source electrodes 7 are formed in the areas where the source regions 4 are exposed, and the source electrodes 7 are then patterned (FIG. 1). Next, the drain electrode 8 is formed on the second main surface of the semiconductor substrate 1 (FIG. 1).

The materials of the source electrodes 7 and the drain electrode 8 may be aluminum, nickel, titanium, or gold, or a composite thereof. A thermal treatment at about 1000° C. may be applied to the semiconductor device after the formation of the source electrodes 7 and the drain electrode 8, in order to lower the contact resistance between the source regions 4 and the semiconductor substrate 1.

Through the process steps above, the main portion of the vertical MOSFET of silicon carbide has been completed as shown in FIG. 1.

Next, the effects of the vertical MOSFET of this preferred embodiment will be described. The mention below is made prior to the description.

The breakdown voltage between the source and drain of a vertical MOSFET is determined by avalanche conditions at the pn junction between the base regions 3 and the drift layer 2. Accordingly, in order to prevent device breakage due to the punch-through of the depletion layer extending in the base regions 3 from the pn junction, it is necessary to set the impurity concentration of the base regions 3 sufficiently higher than the impurity concentration of the drift layer 2 (by at least one order of magnitude, or preferably by two or more orders of magnitude).

On the other hand, when the impurity concentration of the base regions 3 is high, the threshold voltage of the gate electrode 6 is high. Furthermore, when the impurity concentration of the base regions 3 is high, the channel conductivity (channel mobility) is lowered due to impurity scattering, and the channel resistance is increased. Thus, the MOSFET suffers large loss during on operation when the impurity concentration of the base regions 3 is set high.

Also, lowering the impurity concentration of the drift layer 2 directly leads to increased on-state resistance.

In summary, lowering the impurity concentration of the base regions 3 achieves loss (high channel mobility, for example) during on operation of the MOSFET. However, ensuring high breakdown voltage requires lowering the impurity concentration of the drift layer 2 at the same time. However, lowering the impurity concentration of the drift layer 2 directly leads to increased on-state resistance.

MOSFETs of conventional techniques are unable to achieve both of the suppression of loss (e.g. high channel mobility, high threshold voltage) in on operation of MOSFETs and the ensuring of high breakdown voltage.

Now, according to the invention of this preferred embodiment, the drift layer 2 has the second region 2b with a relatively high impurity concentration. This lowers the on-state resistance. Also, the drift layer 2 has the first region 2a with a relatively low impurity concentration formed in the vicinity of the surface. Accordingly, even when the impurity concentration of the base regions 3 that are formed in the first region 2a is lowered, there can be a sufficiently large difference between the impurity concentration of the drift layer 2 (specifically, the first region 2a) and the impurity concentration of the base regions 3 (which can be regarded as the third region 3a in this preferred embodiment).

That is, by forming the drift layer 2 with the first region 2a and the second region 2b having the above-described impurity contents, it is possible to achieve reduced on-state resistance and increased device breakdown voltage (e.g. high breakdown voltages of 10 V to 3 kV or higher).

Also, in the MOSFET of this preferred embodiment, the base regions 3 have the third region 3a formed near the surface and the fourth region 3b formed in deeper portions. The impurity concentration of the third region 3a is lower than the impurity concentration of the fourth region 3b.

Thus, in the region where the third region 3a resides, it is possible to set a larger difference between the impurity concentration of the drift layer 2 (particularly, the first region 2a) and the impurity concentration of the third region 3a. This enables higher breakdown voltage of the device.

Also, the presence of the third region 3a with a relatively low concentration suppresses or reduces the loss in ON operation of the MOSFET.

Furthermore, the presence of the fourth region 3b with a relatively high impurity concentration suppresses the expansion of depletion layer in the base regions 3. Accordingly, the occurrence of punch-through is prevented even when relatively high voltage is applied to the device. That is, higher breakdown voltage of the device is achieved.

The impurity concentration of the first region 2a is set not less than $5 \times 10^{12}/cm^3$ nor more than $5 \times 10^{16}/cm^3$. The impurity concentration of the second region 2b is set not less than $1 \times 10^{15}/cm^3$ nor more than $1 \times 10^{17}/cm^3$. The impurity concentration of the third region 3a is set not less than $5 \times 10^{13}/cm^3$ nor more than $1 \times 10^7/cm^3$. The impurity concentration of the fourth region 3b is set not less than $1 \times 10^{17}/cm^3$. The thickness of the first region 2a is not more than 1 μm (needless to say, zero is not included), and the thickness of the third region 3a is not more than 0.2 μm (needless to say, zero is not included).

The MOSFET thus constructed provides a silicon carbide MOSFET with the most excellent breakdown voltage in practice and with the lowest operating loss in ON state.

Figure 16:
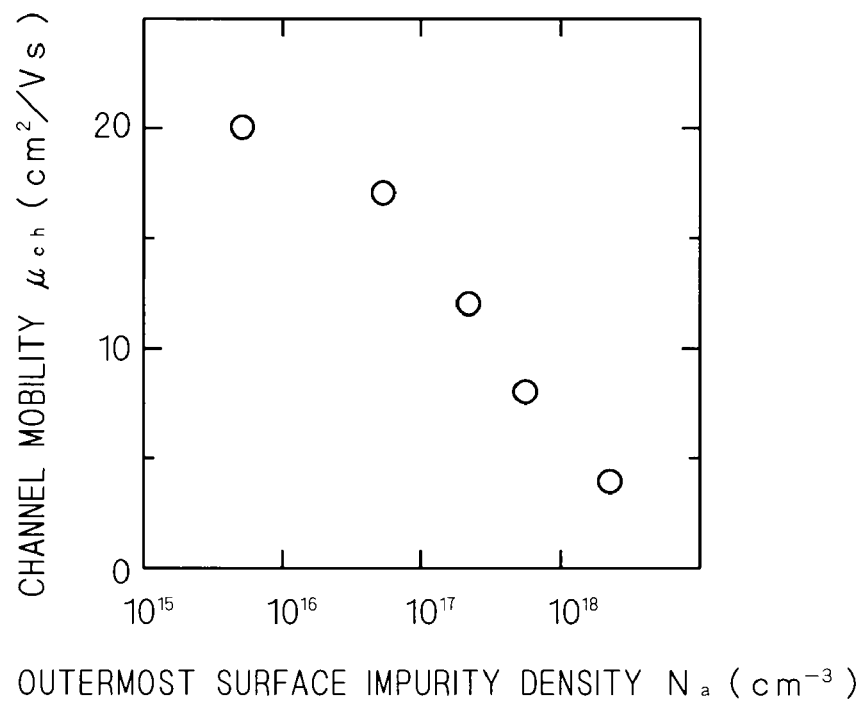
FIG. 16 A diagram showing the results of an experiment on the relation between channel layer impurity concentration and channel mobility.
Figure 17:
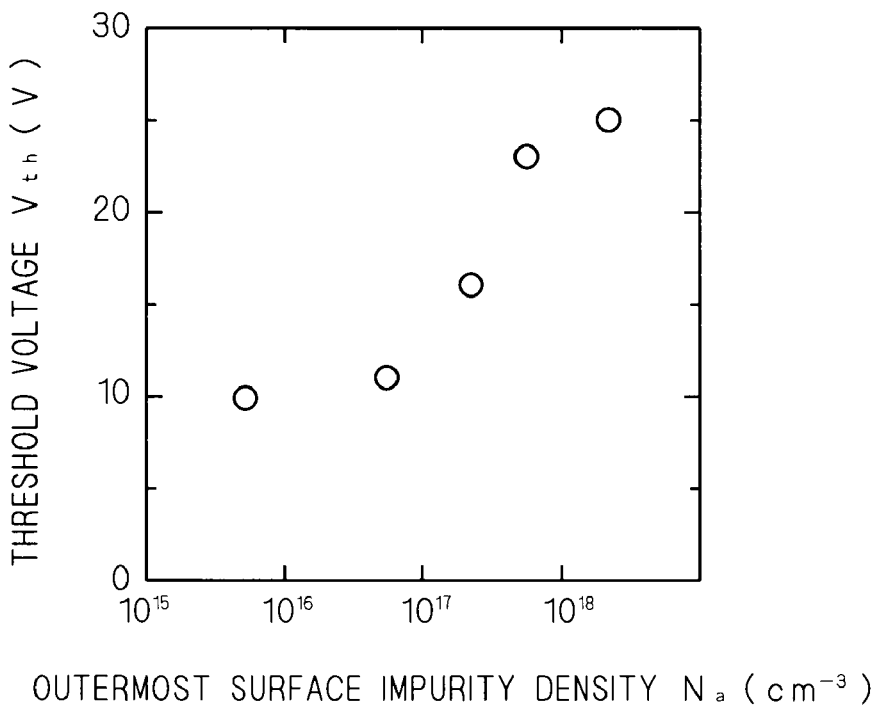
FIG. 17 A diagram showing the results of an experiment on the relation between channel layer impurity concentration and gate threshold voltage.

FIGS. 16 and 17 show the results of experiments that illustrate the performance of the vertical silicon-carbide MOSFET of this preferred embodiment. Specifically, in the MOSFETs subjected to the experiments, the first main surface of the semiconductor substrate 1 has a (0001) surface orientation. An n-channel is formed on the semiconductor substrate 1.

The thickness of the drift layer 2 is 12 μm, and the impurity concentration of the second region 2b of the drift layer 2 is $1 \times 10^{16}/cm^3$. The thickness and impurity concentration of the first region 2a, the thickness of the third region 3a, and each impurity concentration of the fourth region 3b are within the values mentioned above.

It was confirmed that all MOSFETs subjected to the experiments exhibited a breakdown voltage of 1.2 kV.

FIG. 16 depicts experimental results showing the relation between the impurity concentration NA of the p-type third region 3a of the MOSFETs (horizontal axis) and the channel mobility μch of the MOSFETs (vertical axis). FIG. 17 depicts experimental results showing the relation between the impurity concentration NA of the third region 3a (horizontal axis) and the threshold voltage Vth of the MOSFETs (vertical axis).

It was confirmed from FIG. 16 that the channel mobility μch increases as the impurity concentration of the third region 3a decreases. It was confirmed from FIG. 17 that the threshold voltage Vth decreases as the impurity concentration of the third region 3a decreases. The experimental results agree with the effect described above (the effect of reducing the on-state loss of MOSFET).

According to the MOSFET of this preferred embodiment, the presence of the first region 2a with a relatively low impurity concentration makes it possible to maintain high breakdown voltage even when the impurity concentration of the third region 3a is also set low (for example, it can be lowered to $5 \times 10^{13}/cm^3$). This makes it possible to provide a MOSFET that offers high channel mobility (e.g. about 20 $cm^2/Vs$) and low threshold voltage (e.g. about 10 V) while maintaining high breakdown voltage.

Furthermore, unlike that of the technique of Patent Document 1, the MOSFET of this preferred embodiment does not have an accumulation mode structure. Accordingly, it is easy to provide normally-OFF MOSFETs.

FIG. 18 is a diagram showing profiles of the donor concentration and acceptor concentration in a p-type base layer, with the p-type third region 3a of the MOSFET having an impurity concentration NA of $2 \times 10^{17}/cm^3$. FIG. 19 is a diagram showing profiles of the donor concentration and acceptor concentration in a p-type base layer, with the p-type third region 3a of the MOSFET having an impurity concentration NA of $1 \times 10^{16}/cm^3$.

When NA is $2 \times 10^{17}/cm^3$, it is not necessary to utilize this invention because it is sufficiently higher than the drift layer concentration of $1 \times 10^{16}/cm^3$. However, as can be seen from the results of FIGS. 16 and 17, the channel mobility is low and the threshold voltage is high. When NA is $1 \times 10^{16}/cm^3$, the first preferred embodiment is adopted, and the donor concentration is lowered to about $2 \times 10^{14}/cm^3$ in the surface region. In this case, as can be seen from the results of FIGS. 16 and 17, the channel mobility is high and the threshold voltage is low.

As to the on-state characteristics of the vertical MOSFETs where NA is $2 \times 10^{17}/cm^3$ and NA is $1 \times 10^{16}/cm^3$, high current was obtained when this preferred embodiment was employed and NA was $1 \times 10^{16}/cm^3$. The on-state resistance was 53 mΩ$cm^2$ when this preferred embodiment was not employed and NA was $2 \times 10^{17}/cm^3$, while the resistance was reduced to 26 mΩ$cm^2$ when this preferred embodiment was employed and NA was $1 \times 10^{16}/cm^3$.

Second Preferred Embodiment

The first preferred embodiment has described a procedure in which the formation of the drift layer 2 having the first region 2a and the second region 2b is followed by the formation of the base regions 3 having the third region 3a and the fourth region 3b. Alternatively, the procedure shown in FIG. 20 may be adopted.

That is, first, the second region 2b, a part of the drift layer 2, is grown with a high impurity concentration on the semiconductor substrate 1 (a first growth, shown by the solid line in FIG. 20) while maintaining the high impurity concentration approximately constant (e.g. which is about $1 \times 10^{16}/cm^3$ and an n-type impurity concentration).

Figure 20:
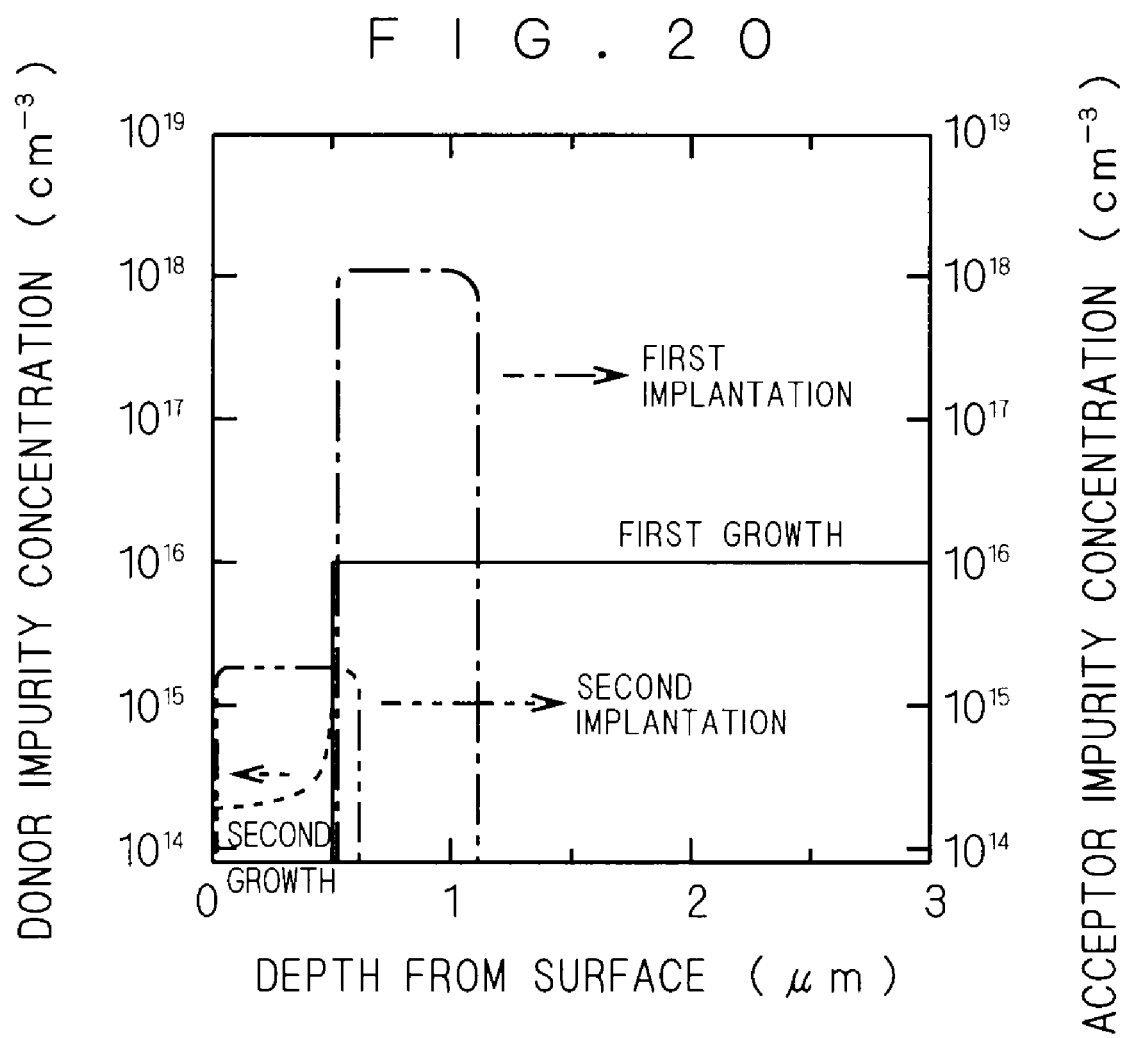
FIG. 20 A diagram illustrating a manufacturing method according to a second preferred embodiment.

Next, an ion implantation process is applied to the second region 2b (a first implantation, shown by the single-dotted oblique line on the right side in FIG. 20). This ion implantation is applied to a depth of about 0.5 μm from the surface of the second region 2b, for example. The impurity ions are p type, and its concentration is approximately constant at about $1 \times 10^{18}/cm^3$, for example. Thus, the fourth region 3b, a part of the base regions 3, is formed in the surface of the second region 2b.

A device structure having desired breakdown voltage is formed by the first growth and the first implantation.

Next, the first region 2a, a part of the drift layer 2, is grown on the second region 2b that has been processed as shown above (a second growth, shown by the broken line in FIG. 20)

with a low impurity concentration (e.g. which is about $2\times10^{14}/cm^3$ and is an n-type impurity concentration).

Next, an ion implantation process is applied to the first region $2a$ and the second region $2b$ (a second implantation, shown by the double-dotted oblique line on the left side in FIG. 20). This ion implantation is applied to a depth of about 0.6 μm from the surface of the first region $2a$, for example. The impurity ions are p type, and its concentration is approximately constant at about $2\times10^{15}/cm^3$, for example. Thus, the third region $3a$, a part of the base regions 3, is formed in the surface of the first region $2a$.

A device structure having low ON-state loss is formed by the second growth and the second implantation.

FIG. 20 is intended to show an example, and the impurity concentrations and thicknesses (depths) of the regions $2a$, $2b$, $3a$ and $3b$ are set in the same ranges as described in the first preferred embodiment.

In the growth process for the formation of the first region $2a$, the impurity concentration may be lowered as the growth progresses. That is, the first region $2a$ may have a concentration distribution in which the impurity concentration becomes lower from the bottom to the surface. This further reduces the impurity concentration in the outermost surface of the second region $2a$ where a channel is formed.

In this way, according to the manufacturing method of this preferred embodiment, a set of growth and implantation is performed twice, and the sets of processes can be conducted in different growth furnaces.

Accordingly, for example, it is possible to conduct the first growth in a reactor chamber for $N_2$ doping and the second growth in a reactor chamber without $N_2$ doping. In such a case, the second growth is not affected by remaining $N_2$ ($N_2$ that would remain in the reactor chamber in the second growth, when the two growth processes are conducted in one reactor chamber). That is, it is possible to more precisely form the first region $2a$.

In the manufacturing method of this preferred embodiment, as shown in FIG. 20, the base regions 3 having the fourth region $3b$ and the third region $3a$ are formed by two steps of ion implantation with box profile distributions (i.e. the amount of ion implant is approximately constant in each ion implantation step, and the impurity concentration remains almost unchanged with respect to the depth in each ion implantation step as shown in FIG. 20).

Accordingly, it is easy, in the first ion implantation step, to design the profile for the fourth region $3b$ having such an impurity concentration and a depth (thickness) as to suppress the punch-through. Also, it is easy, in the second ion implantation step, to design the profile for the third region $3a$ having such an impurity concentration and a depth (thickness) as to reduce the on-state loss of the device.

Also, in the ion implantation processing, influences of the previous ion implantation step are avoided by alternately performing growth and implantation steps as described above. Accordingly, the ion implantation processing to the vicinity of the surface (the ion implantation processing to the vicinities of the surfaces of the base regions 3) is not affected by the preceding ion implantation steps. This allows reduced impurity concentration of the second conductivity type in the vicinities of the surfaces of the base regions 3 (for example, the impurity concentration can be lowered to about $5\times10^{13}/cm^3$).

After the formation of the base regions 3, the MOSFET manufacturing process is conducted as described in the first preferred embodiment. The MOSFET manufactured by this preferred embodiment has a structure as shown in FIGS. 1 and 2.

The preferred embodiments have described the first conductivity type as n type and the second conductivity type as p type. However, needless to say, the semiconductor device of the present invention is applicable also when the first conductivity type is p type and the second conductivity type is n type. An n-channel MOSFET is realized when the first conductivity type is n type, and a p-channel MOSFET is realized when the first conductivity type is p type.

As to the surface orientation of the first main surface of the semiconductor substrate 1, it can be a (0001) plane, a (000-1) plane, or a (11-20) plane. The drift layer 2 grows according to the surface orientation of the semiconductor substrate 1. Accordingly, the surface orientation of the drift layer 2 is the same as the surface orientation of the first main surface of the semiconductor substrate 1.

Now, as to the surface orientation of the first main surface of the semiconductor substrate 1, using a (000-1) plane or a (11-20) plane provides larger channel mobility than adopting a (0001) plane.

Also, it is known that, in the region of the drift layer 2 between the base regions 3 of the second conductivity type (this region exists in the vicinity of the surface of the drift layer 2 of the first conductivity type), the JFET resistance component increases when the first conductivity type impurity concentration in this region is low. Accordingly, for example, after the completion of the structure of FIG. 6, an impurity ion implantation process of the first conductivity type is applied to the region between the base regions 3. This ion implantation controls the impurity concentration of the first conductivity type in the region between the base regions 3, and suppresses the increase of the JFET resistance.

While the invention has been described in detail, the foregoing description is in all aspects illustrative and not restrictive. It is understood that numerous other modifications and variations can be devised without departing from the scope of the invention.

The invention claimed is:

1. A MOSFET comprising:
a drift layer (2) formed on a main surface of a substrate (1), said drift layer having a first conductivity type and made of silicon carbide;
a base region (3) formed in a surface of said drift layer and having a second conductivity type; and
a source region (4) formed in a surface of said base region and having the first conductivity type,
said drift layer having a first region ($2a$) extending from the surface to a first given depth and a second region ($2b$) formed in a region deeper than said first given depth,
said first region having an impurity concentration lower than that of said second region.

2. The MOSFET according to claim 1, wherein the impurity concentration of said first region is not less than $5\times10^{12}/cm^3$ nor more than $5\times10^{16}/cm^3$.

3. The MOSFET according to claim 1, wherein the impurity concentration of said second region is not less than $1\times10^{15}/cm^3$ nor more than $1\times10^{17}/cm^3$.

4. The MOSFET according to claim 1, wherein said first region has the thickness of not more than 1 μm.

5. The MOSFET according to claim 1,
wherein said base region has a third region ($3a$) extending from the surface to a second given depth and a fourth region ($3b$) formed in a region deeper than said second given depth, and
said third region has an impurity concentration lower than that of said fourth region.

6. The MOSFET according to claim 5, wherein said first region of said drift layer is deeper than said third region of said base region.

7. The MOSFET according to claim 5, wherein the impurity concentration of said third region is not less than $5\times10^{13}/\text{cm}^3$ nor more than $1\times10^{17}/\text{cm}^3$.

8. The MOSFET according to claim 5, wherein the impurity concentration of said fourth region is not less than $1\times10^{17}/\text{cm}^3$.

9. The MOSFET according to claim 5, wherein said third region has the thickness of not more than 0.2 μm.

10. The MOSFET according to claim 5, wherein said third region has such the thickness that said base region does not cause punch-through due to a depletion layer extending from a pn junction between said base region and said drift layer.

11. The MOSFET according to claim 1, wherein the surface of said drift layer has a (11-20) surface orientation.

12. The MOSFET according to claim 1, wherein the surface of said drift layer has a (000-1) surface orientation.

13. A MOSFET manufacturing method comprising the steps of:

(A) growing a drift layer (2b) on a semiconductor substrate (1), said drift layer having a first conductivity type and a relatively high impurity concentration;

(B) implanting impurity ions of a second conductivity type with a relatively high concentration into said relatively-high-impurity-concentration drift layer, so as to form a base region (3b) having a relatively high impurity concentration;

(C) growing a drift layer (2a) having the first conductivity type and having a relatively low impurity concentration on said relatively-high-impurity-concentration drift layer; and (D) implanting impurity ions of the second conductivity type with a relatively low concentration into said relatively-low-impurity-concentration drift layer, so as to form a base region (3a) having a relatively low impurity concentration, said step (A) and said step (C) being conducted in different reactor chambers.

14. The MOSFET manufacturing method according to claim 13, wherein the amount of ion implant is kept approximately constant in each of said step (B) and said step (D).

* * * * *